United States Patent [19]

Hoffman et al.

[11] Patent Number: 4,528,747

[45] Date of Patent: Jul. 16, 1985

[54] METHOD AND APPARATUS FOR MOUNTING MULTILEAD COMPONENTS ON A CIRCUIT BOARD

[75] Inventors: Brian D. Hoffman, Hillsborough Township, Somerset County, N.J.; Steven H. Pollack, Makefield Township, Lower Bucks County, Pa.; Barry Weissman, West Windsor, N.J.

[73] Assignee: AT&T Technologies, Inc., New York, N.Y.

[21] Appl. No.: 446,142

[22] Filed: Dec. 2, 1982

[51] Int. Cl.³ .................... H05K 3/30; B23P 19/00
[52] U.S. Cl. .................... 29/834; 29/741; 29/845; 269/157; 269/243; 269/287; 269/903
[58] Field of Search ............... 29/832, 834, 837, 840, 29/739, 740, 741, 759, 281.1, 721, 845; 269/287, 903, 157, 243; 294/86 R

[56] References Cited

U.S. PATENT DOCUMENTS

| | | |
|---|---|---|
| 3,241,222 | 3/1966 | Timmermans . |
| 3,508,315 | 4/1970 | Hoffken . |
| 3,623,637 | 11/1971 | Miller ........................ 29/739 X |
| 3,779,291 | 12/1973 | Yeo . |
| 3,812,569 | 5/1974 | Kufner et al. . |
| 3,849,873 | 11/1974 | Coffin ........................ 29/759 X |
| 3,859,723 | 1/1975 | Hamer et al. .................. 29/840 |
| 3,887,998 | 6/1975 | Hartleroad ................... 29/740 X |
| 3,982,979 | 9/1976 | Hentz et al. ................. 29/834 X |
| 4,102,043 | 7/1978 | Andrade et al. ................ 29/739 |
| 4,212,102 | 7/1980 | Drinkard, Jr. ............... 29/837 X |
| 4,312,622 | 1/1982 | Favareto . |
| 4,375,126 | 3/1983 | Düll et al. .................. 29/832 X |
| 4,386,464 | 6/1983 | Yanai et al. ................... 29/834 |
| 4,434,550 | 3/1983 | Wilke et al. .................. 29/837 |
| 4,493,579 | 7/1983 | Van Hooreweder ............. 29/834 X |

FOREIGN PATENT DOCUMENTS

| | | |
|---|---|---|
| 2915366 | 10/1979 | Fed. Rep. of Germany . |
| 147451 | 4/1981 | Fed. Rep. of Germany ........ 29/837 |
| 150680 | 9/1981 | Fed. Rep. of Germany ........ 29/741 |
| 1367921 | 6/1964 | France . |
| 1372336 | 10/1974 | United Kingdom . |
| 1448404 | 9/1976 | United Kingdom . |
| 1453557 | 10/1976 | United Kingdom . |
| 746776 | 7/1980 | U.S.S.R. ....................... 29/741 |

OTHER PUBLICATIONS

Western Electric Tech. Digest, No. 60, Oct. 1980, pp. 9 and 10, "Vibrating Loading Apparatus" by W. J. Edwards.

Primary Examiner—Mark Rosenbaum
Assistant Examiner—Carl J. Arbes
Attorney, Agent, or Firm—M. M. de Picciotto; R. B. Levy

[57] ABSTRACT

A method for mounting one or a plurality of multilead components (25–28) on a circuit board (20) is herein disclosed. The method comprises the steps of loading a releasable template (32) with the component/components to be mounted, positioning the releasable template proximate to the board, releasing the component/components from the template onto the board such that each lead of each component is proximate to a corresponding aperture in the board, and imparting a vibratory motion (via 29 and 23) to the board thereby inserting the component/components into the board. Also disclosed are various embodiments of an apparatus for achieving this mounting method using a programmable robotic arm (FIG. 2).

28 Claims, 7 Drawing Figures

METHOD AND APPARATUS FOR MOUNTING MULTILEAD COMPONENTS ON A CIRCUIT BOARD

TECHNICAL FIELD

The present invention relates to the mass production of circuit boards, and more particularly to a method and an apparatus for simultaneously mounting one or a plurality of multilead components on circuit boards.

BACKGROUND OF THE INVENTION

The production of electrical and electronic circuit boards often requires the mounting of several multilead electrical components on each board. Usually, such mounting techniques involve manual insertion of the leads of the multilead components, one component at a time, in corresponding holes of a circuit board. Clearly, such techniques result in small throughput, are time consuming, and labor intensive. Moreover, with electrical component packages becoming smaller in size, and with the number of leads on each package substantially increasing to achieve higher packaging densities, the problem of operator fatigue becomes a major one.

Several attempts were made to avoid the foregoing hindrances of manual insertion of a multilead component by resorting to automation. In the area of automatically mounting a multilead component or an I.C. package on a printed wiring board (PWB), the emphasis has been on achieving a high degree of accuracy in the positioning of the component held by a robotic hand or an automatic manipulator with respect to the holes of the PWB. Such high accuracies and close tolerances in the design and control of the robotic hand result in a complex and expensive automatic apparatus for accurately positioning the leads or terminals of the component with respect to their corresponding holes. Such an automatic apparatus is capable of mounting or inserting only one multilead component at a time into the PWB. Furthermore, the foregoing strict hand positioning requirements do not and cannot compensate for any dimensional deviations existing between the outer housing of the component and its leads.

A technique for automatically mounting a multilead component on a board is described in U.S. patent application Ser. No. 382,263 filed on May 26, 1982 and assigned to the assignee herein. Such a technique comprises the steps of placing the multilead component on the board such that each one of its leads is proximate to its corresponding hole in the board, and vibrating the board to cause the leads to fall into the holes. This technique clearly overcomes the above-mentioned strict design requirements on the robotic hand, as well as the component dimensional deviations problem. Although this technique operates satisfactorily for its intended purpose, it is capable of mounting only one multilead component at a time on the board.

SUMMARY OF THE INVENTION

The foregoing problems are solved in accordance with one illustrative embodiment of the present invention wherein a method for simultaneously mounting a plurality of multilead components on a board comprises the steps of holding the plurality of components proximate to the board, simultaneously placing the plurality of components on the board such that each lead of each component is proximate to its corresponding aperture in the board, and imparting a vibratory motion to the board thereby inserting each lead of the components into its corresponding aperture in the board.

In a further embodiment of the invention, the holding step comprises the steps of loading a releasable template, having a plurality of openings substantially matching the dimensions of the components, with the plurality of components to be mounted; and positioning the loaded releasable template proximate to the board in a direction substantially parallel thereto. In another embodiment of the invention, the holding step comprises the steps of positioning a releasable template, having a plurality of openings substantially matching the dimensions of the components, proximate to the board in a direction substantially parallel thereto, and loading the openings of the releasable template with corresponding components to be mounted. In either one of these two embodiments, the positioniong step may comprise the step of controlling a programmable manipulator (e.g., a robotic arm) for holding the releasable template at a preselected coordinate position with respect to the board.

In accordance with another illustrative embodiment, the above-mentioned releasable template and programmable robotic arm are used to mount a multilead electrical component on a printed wiring board (PWB). The method for achieving such a mounting comprises the steps of holding the multilead electrical component in an opening of the releasable template, holding the releasable template by means of the programmable robotic arm, placing the releasable template at a preselected coordinate position with respect to the PWB such that each lead of the component is proximate to its corresponding aperture in the PWB, releasing the component out of the opening of the template onto the PWB, and vibrating the PWB in directions substantially parallel to its plane thereby causing each lead of the multilead electrical component to be inserted in its corresponding aperture in the PWB.

One advantage of the present invention is the ability to automatically mount a plurality of multilead components on boards regardless of reasonable dimensional deviations in the position of the outer housing of the components relative to their leads.

Another advantage of the present invention is the ability to simultaneously mount several types of multilead components having diverse geometries on the same board without requiring operator assistance.

A further advantage of the present invention is the capability of mounting a plurality of multilead components using a single programmable robotic arm.

A still further advantage of the present invention is the ability to maximize circuit board throughput by minimizing the robotic arm motions.

These and other advantages of this invention will appear more fully upon consideration of the illustrative embodiments now to be described in detail in connection with the accompanying drawings.

DETAILED DESCRIPTION

Figure 1:
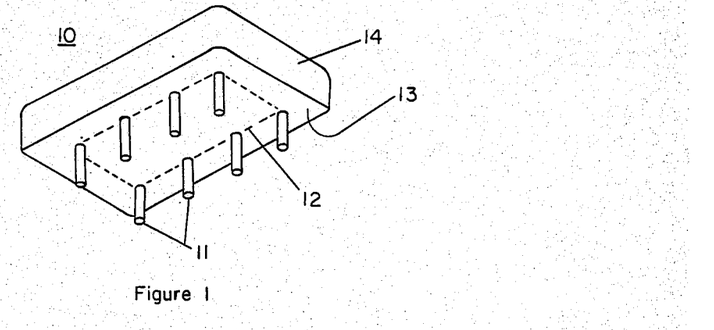
FIG. 1 is a perspective view of a typical multilead component to be mounted on a board using an embodiment of the method and apparatus of the present invention.

Illustratively shown in FIG. 1 is a component 10 having a plurality of leads 11 arranged or aligned in accordance with a pattern 12 on one side or surface 13 of such component. The component 10, as shown, has an outer body housing 14 generally shaped as a parallelepiped. However, the hereafter described inventive concepts are also applicable to components having cylindrical, cubical or any other outer body shape. Also, the leads 11 may be arranged in any type of pattern 12, such as circular, rectangular, square, or other geometric configurations. Moreover, the present inventive concepts and teachings are applicable to the mounting of multilead components on boards, such multilead components containing electrical devices, electronic circuits, other type of objects or articles, or any combination thereof.

Figure 2:
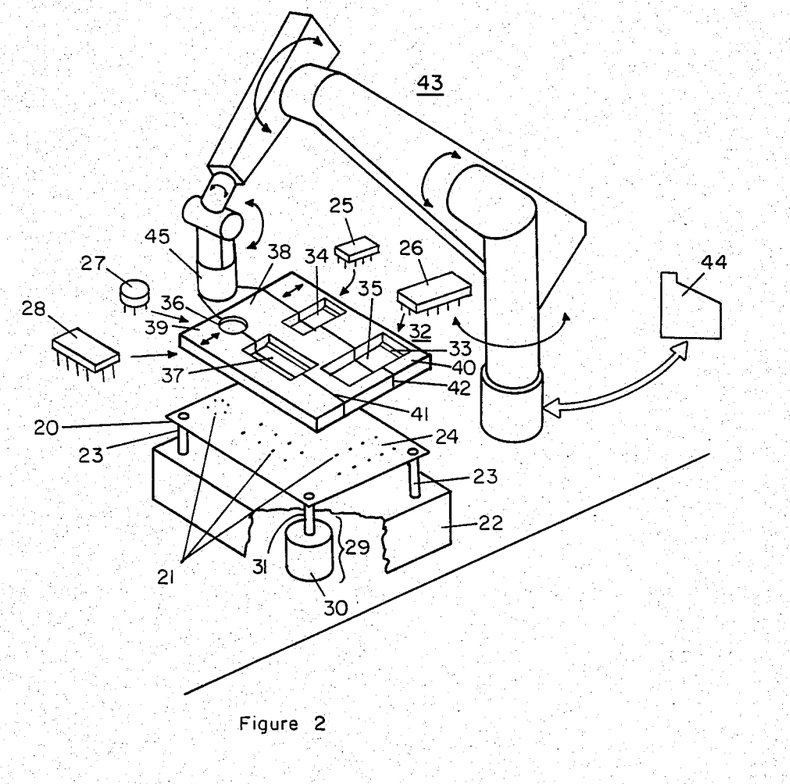
FIG. 2 is a perspective view of an apparatus in accordance with one illustrative embodiment of the present invention.

Shown in FIG. 2 is an apparatus for mounting components in accordance with one embodiment of the present invention. A board 20 having a plurality of holes or apertures 21 arranged in various patterns, e.g., 24, is mounted on a base 22 by means of a plurality of mounting bodies 23. A plurality of multilead components of various shapes 25, 26, 27, 28 are to be mounted on board 20. The leads of each one of the multilead components are to be inserted in predetermined apertures, such as pattern 24, of the board. The apertures 21 on the board 20 are arranged in patterns corresponding to those of the leads of the components 25 to 28 to be mounted thereon. As schematically shown in FIG. 2, the board 20 is further coupled to the base 22 by means of a mechanism 29 capable of imparting a vibratory motion of controlled frequency and amplitude to the board. One way of accomplishing the vibratory motion of the board 20 is to use somewhat compliant mounting bodies 23 attached to the board. One such compliant coupling may be achieved by means of spring mounted legs having one end thereof secured to the base 22 and the other end coupled to the board 20. Alternatively, mounting bodies 23 may include suspension springs (not shown) having one end coupled to the board 20 and the other end secured to a fixed portion of the base 22.

Such vibratory motion, which is preferably in the plane of the board 20, may be accomplished, for example, by means of a motor 30 having an eccentrically mounted shaft 31 thereon, which is attached to the board. However, other types of vibrating mechanisms, as well as vibratory motions in a direction substantially perpendicular to the plane of the board, are also within the spirit and scope of the present invention.

In order to simultaneously mount the components 25 to 28 on the board 20, they are all initially held proximate to the surface of board 20. Next, these components 25 to 28 are simultaneously placed on the surface of the board 20 such that each component has its leads proximate to a corresponding aperture 21 in the board. The holding of the components 25 to 28 prior to placing them on the board 20 is achieved by means of a releasable template 32 having a plurality of openings 34 to 37 adapted to receive the outer bodies of components 25 to 28, respectively. The dimensions of each opening 34 to 37 of the template 32 are selected to substantially match the outer dimensions of the components to be mounted. Also, each opening 34 to 37 of the template 32 is located therein to substantially match the position and orientation of its corresponding component aperture pattern 24 on the board 20. Furthermore, each opening 34 to 37 of the template 32, such as opening 35, may comprise a pair of retaining protrusions or lips, e.g., 33, adapted to hold a corresponding component therein. As shown, the releasable template 32 comprises a central portion 38 releasably coupled to two outer portions 39 and 40 along its two edges 41 and 42. The perspective view of the apparatus of FIG. 2 shows only one of the retaining protrusions of openings 34, 35 and 37, the other protrusion of each opening being opposite to the one shown. In other words, template opening 35, for example, has one retaining protrusion or lip 33 located in the template outer portion 40 and the other retaining protrusion or lip located in the template central portion 38. Further structural and operational details of the "opening" and "closing" of a releasable template in accordance with an embodiment of the invention will be described in connection with FIGS. 6 and 7.

In operation of the illustrative embodiment of FIG. 2, the releasable template 32 is closed and the multilead components 25 to 28 are loaded in their corresponding openings 34 to 37 of the template. As shown in FIG. 2, edge 41 of the central portion 38 "cuts across" openings 36 and 37, while the other edge 42 of the central portion 38 "cuts across" openings 34 and 35. The template 32 with the components loaded therein is positioned proximate to the board 20 in a direction substantially parallel thereto by means of a programmable manipulator 43, e.g. a robotic arm, operating under a computer control terminal 44. The programmable manipulator 43 is of a type capable of lifting a predetermined load comprising the releasable template 32 and the various components loaded therein, and of locating the template with sufficient accuracy proximate to the board such that each component is positioned near its corresponding location on the board. A commercially available programmable manipulator of the foregoing type is, for example, the PUMA Model 560 robotic arm manufactured by Unimation Inc. of Danbury, Conn.

Once the loaded template 32, which is held by manipulator 43 at its wrist 45, is positioned proximate to the board 20, the template portions 38, 39 and 40 are separated from each other. This is achieved by laterally displacing portions 39 and 40 away from the central portion 38, as schematically shown by the directional arrows on the template portions 39 and 40. This results in the enlargement of openings 34 to 37, and in a simultaneous release of the components 25 to 28 out of their respective openings 34 to 37 onto the surface of the board 20. The releasable template 32 is maintained in its parallel position proximate to the board 20 for a delay period. During a portion of such delay period, each component which is placed on the surface of the board 20 is confined within its corresponding opening in the template 32. In other words, the template openings prevent each component from moving away from its corresponding aperture pattern on the vibrating board. At the end of the delay period, the template is withdrawn above the highest component inserted on the board, and is thus ready for a new loading cycle on a new empty board.

Figure 3:
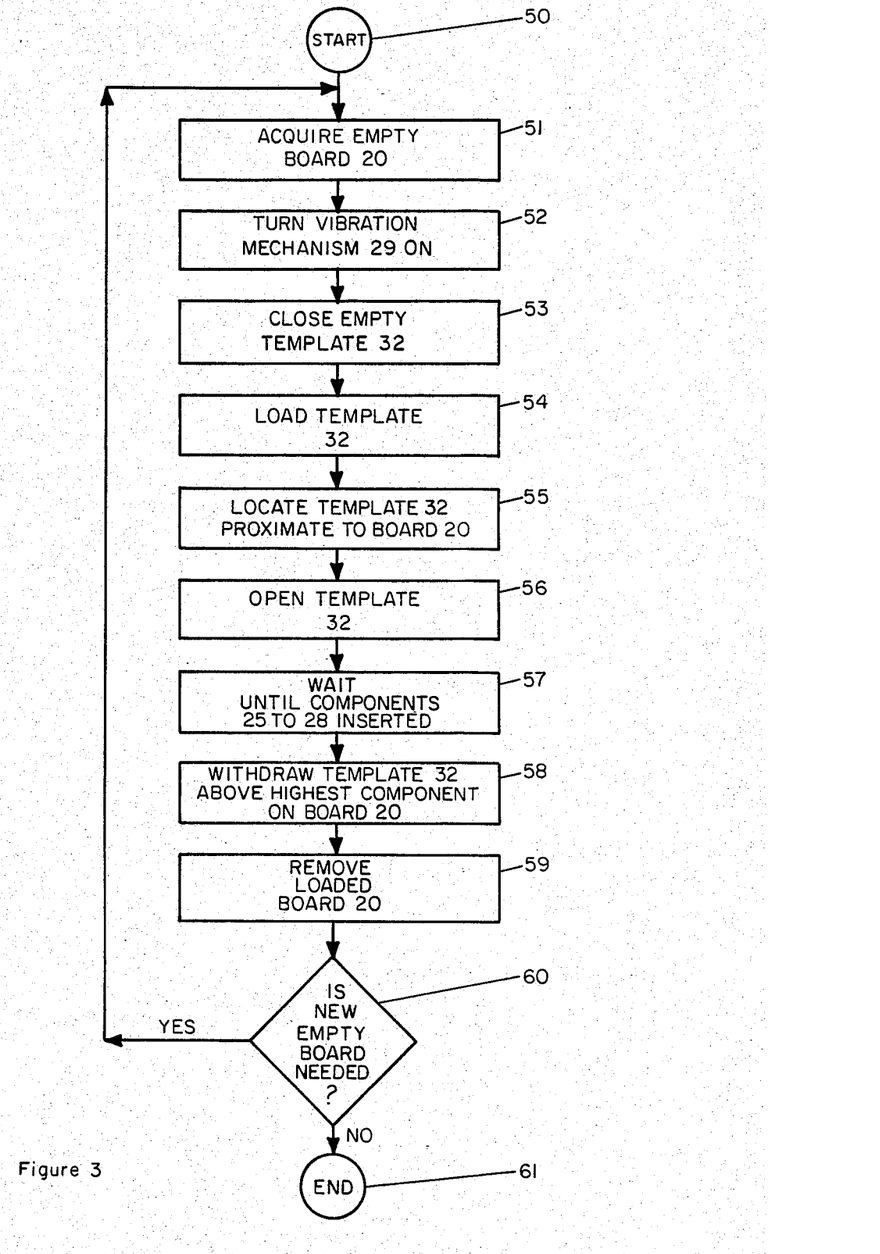
FIG. 3 is a flow chart representation of the steps involved in the operation of the illustrative embodiment of FIG. 2.

The foregoing operational steps of the embodiment of FIG. 2 are illustrated in a flow chart configuration shown in FIG. 3. This flow chart diagram is given herein as one example for controlling and programming the programmable manipulator 43 to achieve the components mounting process in accordance with an embodiment of the invention. It is considered that those skilled in the art would be capable of programming the manipulator to interact with the various hardware elements of this illustrative embodiment.

At the outset, the system is started with the START instruction of block 50. Next, an empty board 20 is mounted on the base 22 as shown by the ACQUIRE EMPTY BOARD 20 instruction in block 51. The vibration mechanism 29 is turned on thus imparting a vibratory motion to board 20 as per block 52. Next, the template 32 which is held by the manipulator 43 at its wrist 45, is "closed" by means of a control instruction given to the manipulator from its control terminal 44. Such control instruction of block 53 is of the type of a close hand, close grippers, or close fingers instruction available on most commercially available robotic arms. Subsequent to instruction block 53, the empty template 32 is closed, i.e., central portion 38 is brought in intimate contact with the two coplanar outer portions 39 and 40, and the template openings 34 to 37 are now reduced or smaller than in their "open" position.

The loading of the template 32 with the respective components 25 to 28 to be mounted may be achieved manually or automatically by means of an appropriate component feeding mechanism. Subsequent to the loading step of block 54, the template 32 is positioned proximate and parallel to the board 20 by directing the wrist 45 of the manipulator 43 to a predetermined coordinate space position relative to the base 22. This is achieved in block 55 by feeding the programmable manipulator 43, via the control terminal 44, with a desired location in space for its wrist 45. Next, the template 32 is opened by means of a control instruction such as open hand, open grippers or open fingers instruction thereby releasing the components 25 to 28 to be mounted out of their now enlarged openings 34 to 37 onto the surface of the vibrating board 20. Subsequent to the opening of the template 32 as per block 56, the template is maintained in its parallel position proximate to the board 20 for a period of time until the components are inserted, as shown by block 57. During the latter, the components to be mounted on the board 20 are confined within their respective template openings until their leads are inserted in their corresponding apertures 21 on the board. The foregoing period of time may be fixed, or may be responsive to sensing means indicative of the insertion state of the respective components.

Shown in block 58 is the next step in the process which consists of withdrawing the open template 32 above the highest inserted component on the board 20 in order not to disengage any of the mounted components. The remaining blocks 59, 60 and 61 of the process are self explanatory in that the loaded board 20 is now to be removed and any new empty board is to be mounted on the base 22 prior to repeating the foregoing series of steps.

Figure 4:
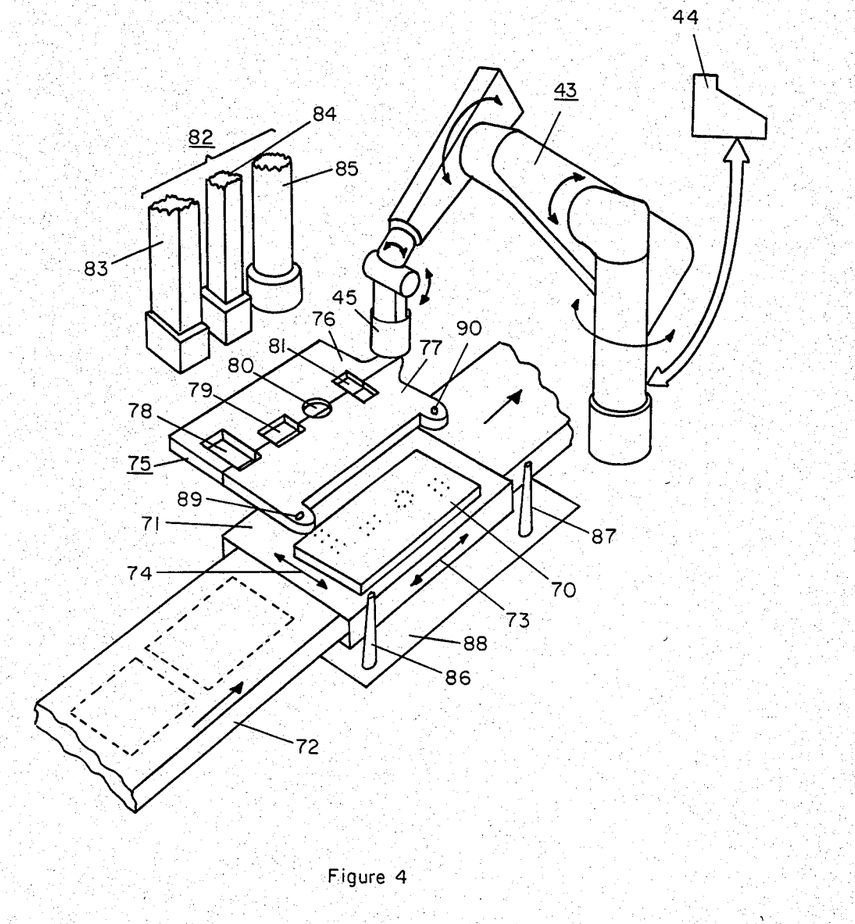
FIG. 4 is a perspective view of an apparatus in accordance with another illustrative embodiment of the present invention.

Another embodiment of the invention is schematically shown in FIG. 4 wherein the programmable robotic arm 43 of FIG. 2 is used to simultaneously mount a plurality of multilead components on a board 70. The latter is transported to a work station 71 by means of a conveyor 72. Work station 71 is illustratively of a vibratory type. Such a vibratory station 71 is capable of oscillating in a first direction 73, a second direction 74, or in any other direction resulting from any combination of the first and second directions 73 and 74. The board 70 is temporarily secured to the vibratory work station 71, and a vibratory motion is thus imparted to the board in accordance with an embodiment of the invention. A releasable template 75 comprising two coplanar portions 76 and 77 has a plurality of openings 78, 79, 80 and 81 adapted to receive a corresponding plurality of components (not shown) to be mounted on board 70. As shown, the template 75 is held at the wrist 45 of the programmable robotic arm 43. In order not to obstruct the drawings, further structural details of the releasable template 75, such as its opening and closing mechanisms, are not shown in FIG. 4 but will be described in connection with FIG. 6. Illustratively shown in FIG. 4 is a components feeding arrangement 82 comprising a plurality of differently shaped feeding tubes 83, 84 and 85. Each of the feeding tubes 83 to 85, which acts as a source of multilead components to be mounted, must be of a type capable of delivering one component at a time at a preselected speed or rate depending upon the overall speed requirements of the components mounting process.

In accordance with an embodiment of the invention, the releasable template 75 is loaded with the component or components to be mounted by locating one of its openings, e.g., 78, adjacent to the feeding tube 83, and by transferring a component out of tube 83 into opening 78 of template 75. During such an operation, template portions 76 and 77 are held together such that the component transferred into opening 78 is held within such opening by means of a pair of retaining protrusions or lips (not shown) similar to the one described above in connection with FIG. 2. In order to transfer a component out of the template 75, template portions 76 and 77 are "separated" from each other thereby enlarging opening 78 and releasing the component out of its corresponding opening.

The loading of the releasable template 75 with the plurality of components to be mounted on board 70 is illustratively accomplished by first locating each opening 78 to 81 underneath its corresponding feeding tube 83, 84 or 85. Next, the components to be mounted are transferred from their respective feeding tubes to their corresponding matching openings of the template 75. Preferably, the loading of the releasable template 75 is achieved by sequentially locating each one of its openings underneath the appropriate feeding tube and by sequentially transferring the components out of the feeding tubes. The placing of the components on the board 70 is achieved by positioning the components-loaded-template 75 in substantially parallel spaced relation to the board 70 at predetermined coordinate positions with respect thereto, and by simultaneously releasing the components out of their respective openings 78 to 81 of the template onto the board. The positioning of the template 75 by means of the programmable robotic arm 43 may be substantially aided by using a set of auxiliary locating devices, e.g., tapered pins 86 and 87, attached to a non-vibrating portion 88 of the work station 71 and adapted to be inserted in mating apertures 89 and 90 of one portion (e.g., 77) of the releasable template 75.

Figure 5:
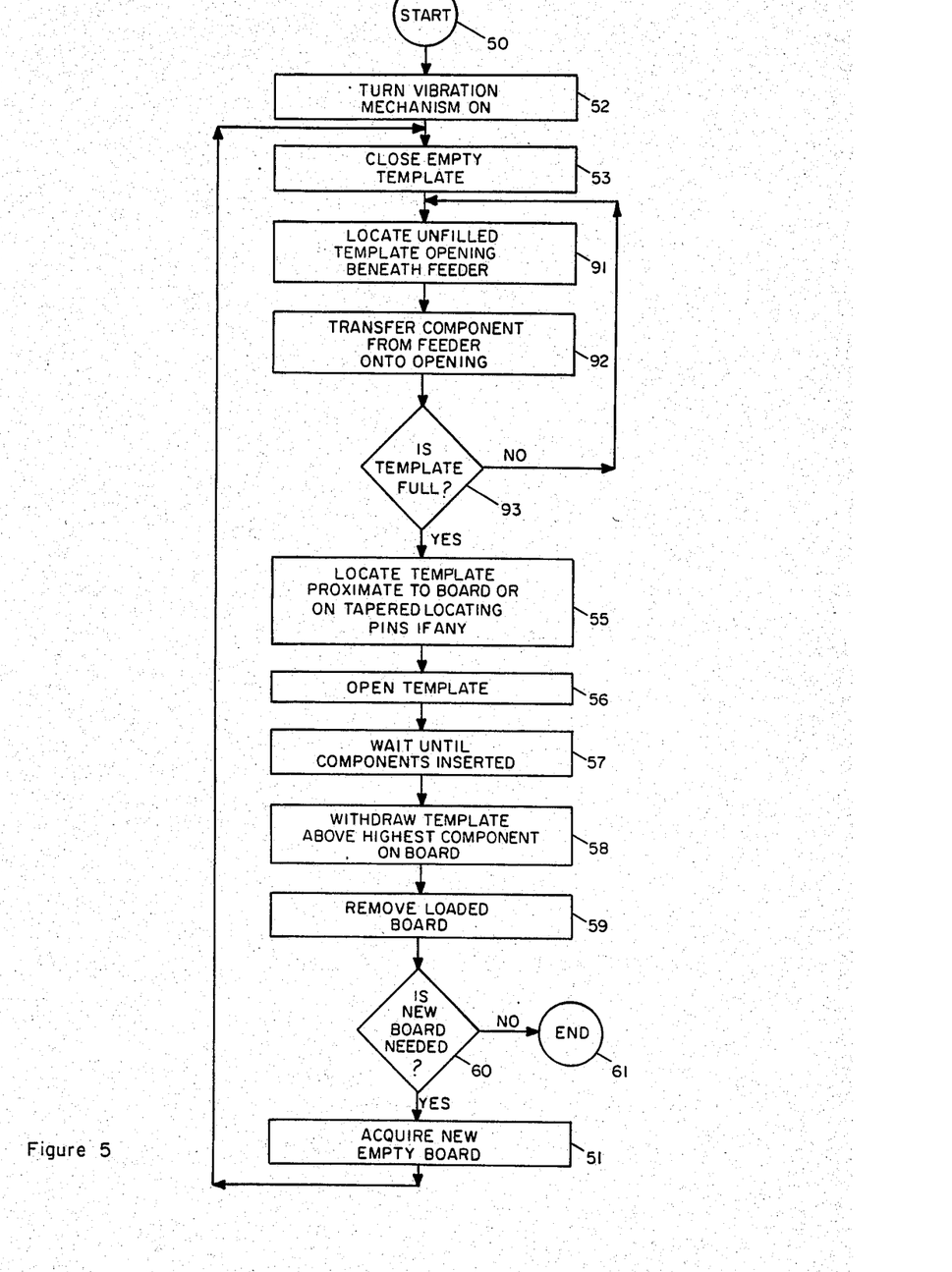
FIG. 5 is a flow chart representation of the steps involved in the operation of the illustrative embodiment of FIG. 4.

The various operational steps of the embodiment of FIG. 4 are illustrated in a flow chart configuration shown in FIG. 5. This flow chart diagram is given herein as one example for controlling and programming the programmable manipulator 43 to achieve the components mounting process in accordance with this embodiment of the invention. It is considered that those skilled in the art would be capable of programming the manipulator to interact with the various hardware elements of this illustrative embodiment. The flow chart of FIG. 5 is similar to the one described in FIG. 3, and comparable functional and programming steps in the former have the same reference numerals as their counterpart in the latter. In accordance with the embodiment of FIG. 4, the loading of the template 75 is achieved by locating an unfilled template opening beneath the feeder (block 91), transferring a component from the feeder onto the template opening (block 92), and repeating the foregoing two steps (block 93) until the template is fully loaded. The remaining operational steps of this flow chart, i.e., steps 50 to 53 and 55 to 61, are similar to the corresponding steps described above in connection with FIG. 3.

Figure 6:
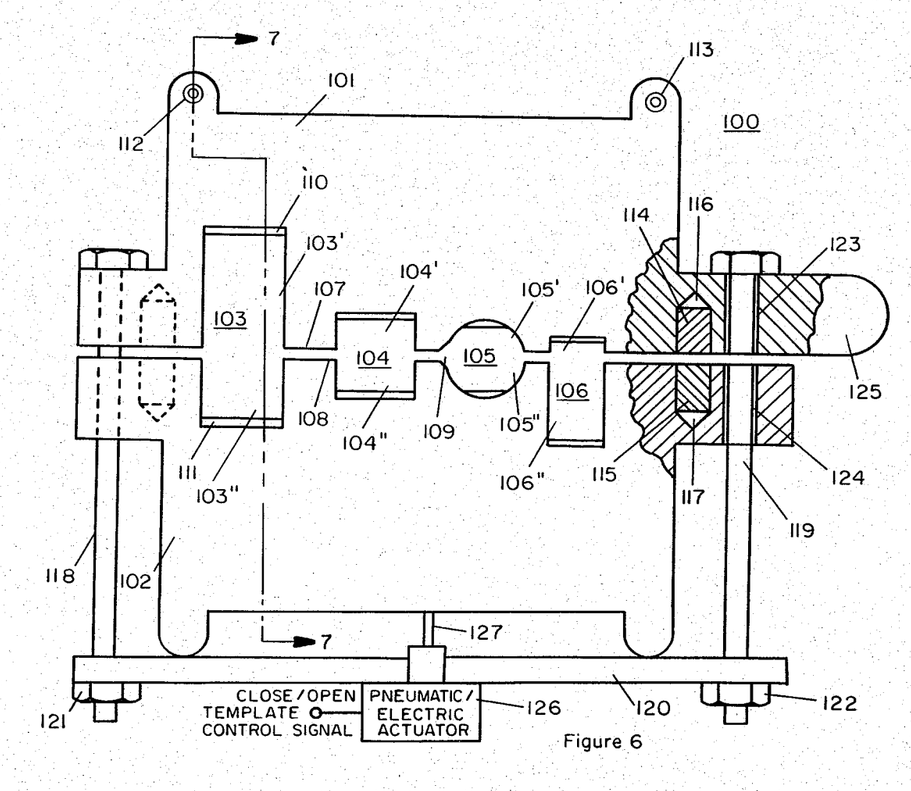
FIG. 6 illustrates a releasable template in accordance with an embodiment of the present invention.

FIG. 6 illustratively shows a releasable template 100 in its "open" or released position in accordance with a further illustrative embodiment of the invention. The releasable template 100 may be used in the above embodiments of FIGS. 2 and 4 as a substitute for templates 32 and 75, respectively. For purpose of illustration only, releasable template 100 is shown as having two coplanar portions 101 and 102. However, releasable templates having more than two portions, such as template 32 of FIG. 2, are well within the spirit and scope of the present invention. As shown in FIG. 6, template portion 101 has a plurality of indentations 103', 104', 105' and 106' along an edge 107 thereof. Similarly, template portion 102 has also a plurality of indentations 103'', 104'', 105'' and 106'' along an edge 108. The two coplanar template portions 101 and 102 are positioned with respect to each other to form a plurality of resulting openings 103, 104, 105 and 106 respectively comprising the combination of indentations 103' and 103'', 104' and 104'', 105' and 105'', and 106' and 106''. Opening 105, adapted to receive a circular component, comprises a reference notch 109. The latter enables a proper positioning of a circular component (not shown) within the template by aligning the notch with a corresponding reference key located on the housing of the component.

The overall dimensions of these openings 103 to 106 in their "closed" position are selected to be somewhat larger than the dimensions of the outer bodies of the components to be mounted. Each opening, e.g., 103, comprises a pair of retaining protrusions or lips 110 and 111, adapted to hold a corresponding component within such opening. These retaining lips 110 and 111 are best shown in the cross-sectional view of FIG. 7. Also, the respective locations of the openings 103 to 106 within template 100 are selected to substantially correspond to the intended locations of the components on the board on which they are to be inserted.

As mentioned above in connection with the embodiment of FIG. 4, in order to facilitate the positioning of the template 100 with respect to a board, portion 101 of the template 100 comprises a pair of locating apertures 112 and 113. The positions and shapes of these apertures 112 and 113 are selected to match those of a pair of mating locating pins (such as 86 and 87 in FIG. 4) attached to a non-vibrating portion of the work station. In a preferred embodiment of the invention, both the locating pins (not shown) and their mating apertures 112 and 113 are tapered, thereby substantially aiding the positioning step of the template.

One arrangement for coupling template portion 101 to template portion 102 may comprise two pairs of permanent magnets of which only one pair of magnets 114 and 115, respectively embedded in opposite cavities 116 and 117 within template portions 101 and 102, is shown. The magnets 114 and 115 are poled to repel each other thereby causing a repulsion force between template portions 101 and 102. In other words, the repulsion force generated by the two magnets 114 and 115 causes the edges 107 and 108 to normally separate from each other resulting in the somewhat enlarged openings 103 to 106 when the template is in its "open" position. Other means for generating a repulsion force between portions 101 and 102 may be used, e.g., a spring arrangement or dual acting air cylinders inserted in cavities 116 and 117 of template portions 101 and 102 may be used to repel portions 101 and 102 from each other.

The coupling arrangement further comprises a pair of fastening bolts 118 and 119 attached to a coupling bar 120 by means of a pair of nuts 121 and 122, respectively. Fastening bolts 118 and 119 are slidably engaged with at least one of the two template portions 101 and 102 in order to permit their coplanar relative movement when the template is to be opened or closed. Fastening bolt 119 is engaged in passages 123 and 124 of template portions 101 and 102, respectively. Similarly, fastening bolt 118 is also engaged with the two template portions. Since the coupling bar 120 is held against the template portion 102, the tightening or loosening of the nuts 121 and 122 will control the maximum distance or gap between edges 107 and 108, and in turn will control the dimensions of the openings 103 to 106 when the releasable template is in its "open" or released position. As mentioned above, the repulsive permanent magnets 114 and 115 will insure that the foregoing distance or gap between the edges 107 and 108 is maintained. The releasable template 100 may be held from a portion 125 thereof, the latter being dimensioned and adapted to be coupled to the wrist of the programmable robotic arm of the type described above in connection with FIGS. 2 and 4. However, holding the releasable template from any other part or portion thereof will not affect its operation provided that the two coplanar template portions 101 and 102 are not simultaneously held by the robotic arm.

The closing of releasable template 100 is achieved by coupling an actuator 126 to the bar 120 such that a displacement output cylinder 127 of the actuator is positioned against the template portion 102. Actuator 126 may be an electrical solenoid, an air cylinder, or any other well known device capable of displacing a cylinder or small shaft in response to a control signal. The template close/open control signal corresponds to the close/open hand or grippers signal usually available on programmable robotic arms. The close template control signal causes the actuator 126 to push its output cylinder 127 against template portion 102 and to close the template 100 by forcing the edge 108 of portion 102 against the edge 107 of portion 101. In other words, since the template portion 101, the bolts 118 and 119, and the coupling bar 120 are coupled together, template portion 102 is the only part of the template coupling arrangement capable of moving in response to the force exerted by cylinder 127. Opening or releasing of the template 100 is achieved by removing the control signal applied to the actuator 126 thus retracting its cylinder 127 and returning the template portion 102 to its initial position away from template portion 101 due to the repulsive force generated by permanent magnets 114 and 115.

Figure 7:
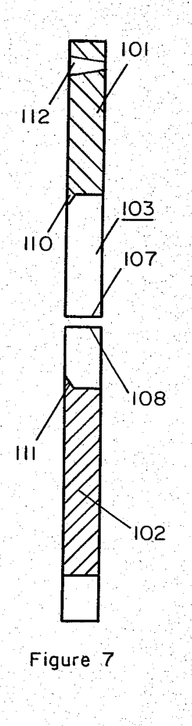
FIG. 7 is a cross-sectional view along line 7—7 of the releasable template of FIG. 6.

Shown in FIG. 7 is an end cross-sectional view of template 100 of FIG. 6 along line 7—7 thereof. The retaining protrusions or lips 110 and 111 are dimensioned such that a multilead component to be mounted is retained within its corresponding template opening 103 when the template 110 is in its "closed" position. In the "open" position of the template 100, as shown in FIG. 7, the lips 110 and 111 are separated from each other thereby enabling the multilead component to be released out of its opening onto a board.

The above-described coupling principles are readily applicable to releasable templates comprising more than two coplanar template portions. For example, in the embodiment of FIG. 2, the releasable template 32 comprises the central template portion 38 and the two outer template portions 39 and 40. The coupling between the central portion 38 and the outer portion 39 may be achieved by positioning in each one of these two template portions, along their common edge 41, a pair of permanent magnets. The magnets in the central portion 38 are poled to repel those in the outer portion 39. Similarly, the coupling between the central portion 38 and the outer portion 40 may be achieved by positioning in each one of these portions 38 and 40, along their common edge 42, a pair of permanent magnets. The latter in central portion 38 are poled to repel the magnets in outer portion 40. Thus, due to the presence of these repelling magnets, a gap is formed on each side of the central portion 38 along its edges 41 and 42. Furthermore, a pair of fastening bolts, a coupling bar and a selectively energizable actuator of the type described above, would enable the "opening" and "closing" of the three-portion releasable template 32 in a similar way as the one described above in connection with the two-portion releasable template 100.

The foregoing illustrative embodiments have been presented merely to illustrate the pertinent inventive concepts of the present invention. Numerous modifications can be made by those skilled in the art without departing from the spirit and scope of the invention.

What is claimed is:

1. A method for simultaneously mounting a plurality of multilead components on a board, said board having a plurality of apertures arranged in patterns corresponding to those of the leads of each one of said components, comprising the steps of:
   loading the components in a releasable template having coplanar portions provided with a plurality of openings therein, the openings each being enlargeable from an initial size substantially matching the dimensions of said components to be mounted;
   simultaneously placing said plurality of components on the surface of the board with a plurality of leads of each component in contact with said surface such that each lead of each component is proximate to its corresponding aperture in said board;
   operating the template to enlarge the openings therein, to release the components onto the board; and
   imparting a relative vibratory motion between the board and the components thereby inserting each lead of said components into its corresponding aperture in the board.

2. A method according to claim 1, wherein the loading step comprises the steps of:
   locating an opening of the releasable template adjacent to a component feeding means; and
   transferring a component to be mounted out of said feeding means into its corresponding matching opening of the template.

3. A method according to claim 1, further including the step of positioning the loaded releasable template proximate the board by controlling a programmable manipulator to hold the releasable template at a preselected coordinate position with respect to the board.

4. A method according to claim 1, wherein the operating step comprises the step of controlling the releasable template to separate the coplanar portions thereof to transfer the multilead components through the enlargeable openings of said releasable template onto the board.

5. A method according to claim 4, wherein subsequent to the components releasing step, the method further comprises the step of maintaining the releasable template substantially parallel to the board thereby confining each component within its corresponding template opening.

6. A method for simultaneously mounting a plurality of multilead components on a board, said board having a plurality of apertures arranged in patterns corresponding to those of the leads of each one of said components, comprising the steps of:
   positioning a releasable template proximate to the board in a direction substantially parallel thereto, the template having coplanar portions provided with a plurality of openings therein, the openings each being enlargeable from an initial size substantially matching the dimensions of said components;
   loading the openings of the releasable template with corresponding components to be mounted;
   simultaneously placing said plurality of components on the board such that each lead of each component is proximate to its corresponding aperture in said board;
   operating the template to enlarge the openings therein to release the components onto the board; and
   imparting a relative vibratory motion between the board and the components thereby inserting each lead of said components into its corresponding aperture in the board.

7. A method according to claim 6, wherein the positioning step comprises the step of controlling a programmable manipulator for holding the releasable template at a preselected coordinate position with respect to the board.

8. A method according to claim 8, wherein the operating step comprises the step of controlling the releasable template to separate the coplanar portions thereof to transfer the multilead components through the enlargeable openings of said releasable template onto the board.

9. A method according to claim 8, wherein subsequent to the components releasing step, the method further comprises the step of maintaining the releasable template substantially parallel to the PWB thereby confining each component within its corresponding template opening.

10. A method for simultaneously mounting a plurality of multilead electrical components on a printed wiring board (PWB) having a plurality of apertures arranged in patterns corresponding to those of the leads of said components, comprising the steps of:
  holding said multilead electrical components in openings of a releasable template by means of a programmable robotic arm;
  placing said releasable template at a preselected coordinate position with respect to the PWB such that each lead of each component is proximate to its corresponding aperture in said PWB;
  simultaneously releasing the components out of the openings of the template onto said PWB; and
  vibrating the PWB in directions substantially parallel to its plane thereby causing each lead of said multilead electrical components to be inserted in its corresponding aperture in said PWB.

11. A method according to claim 10 further comprising the steps of:
  positioning by means of the programmable robotic arm, the releasable template adjacent to a components feeding means;
  sequentially locating each opening of the releasable template underneath the feeding means; and
  transferring the components to be mounted out of said feeding means into their corresponding matching openings of the template.

12. A method according to claim 10, wherein the placing step comprises the step of positioning said releasable template at a predetermined distance from said PWB in a direction substantially parallel thereto.

13. A method according to claim 12, wherein subsequent to the components releasing step, the method further comprises the step of maintaining the releasable template in said position substantially parallel to the PWB thereby confining each component within its corresponding template opening.

14. A method for mounting a multilead electrical component on a printed wiring board (PWB) having a plurality of apertures arranged in a pattern corresponding to that of the leads of said component, comprising the steps of:
  holding said multilead electrical component in an opening of a releasable template;
  holding said releasable template by means of a programmable robotic arm;
  placing said releasable template at a preselected coordinate position with respect to the PWB such that each lead of said component is proximate to its corresponding aperture in said PWB;
  releasing the component out of the opening of the template onto said PWB; and
  vibrating the PWB in directions substantially parallel to its plane thereby causing each lead of said multilead electrical component to be inserted in its corresponding aperture in said PWB.

15. A method for mounting a multilead electrical component on a printed wiring board having a plurality of apertures arranged in a pattern corresponding to that of the leads of said component, comprising the steps of:
  positioning, by means of a programmable robotic arm, a releasable template having an opening formed therein adjacent to a component feeding means;
  locating said opening of the releasable template underneath the feeding means;
  transferring the component to be mounted out of said feeding means into said opening;
  placing said releasable template at a preselected coordinate position with respect to the PWB such that each lead of said component is proximate to its corresponding aperture in said PWB;
  releasing the component out of the opening of the template onto said PWB; and
  vibrating the PWB in directions substantially parallel to its plane thereby causing each lead of said multilead electrical component to be inserted in its corresponding aperture in said PWB.

16. A method according to claim 15, wherein the placing step comprises the step of positioning said releasable template at a predetermined distance from said PWB in a direction substantially parallel thereto.

17. A method according to claim 16, wherein subsequent to the component releasing step, the method further comprises the step of maintaining the releasable template in said position substantially parallel to the PWB thereby confining the component within its corresponding template opening.

18. An apparatus for mounting a multilead electrical component on a board comprising:
  means for supporting the board;
  a releasable template having at least one opening substantially matching the outer body of the component to be mounted;
  component feeding means located adjacent to and operatively associated with said board supporting means for delivering a component and loading said at least one opening in said template with said component to be mounted;
  a programmable robotic arm, located adjacent to said board supporting means and selectively movable with respect to said board supporting means and said component feeding means, for holding and positioning the loaded releasable template at preselected coordinate positions with respect to the board;
  means coupled to said programmable robotic arm for releasing said component out of said at least one opening onto said board; and
  means coupled to said board supporting means for vibrating said board.

19. An apparatus according to claim 18, wherein the releasable template comprises a plurality of coplanar portions, each portion of said plurality of coplanar portions having means for causing a repulsion force between two contiguous portions.

20. An apparatus according to claim 19, wherein the releasable template further comprises fastening means coupled to said plurality of coplanar portions and slidably engaged therewith.

21. An apparatus according to claim 20, wherein said fastening means are dimensioned such that said plurality of coplanar portions are contiguous at a predetermined distance from each other.

22. A releasable template comprising:
  a first planar portion having in one of its edges at least one indentation of predetermined dimensions;
  a second planar portion having in one of its edges at least a second indentation of predetermined dimensions; and
  a coupling arrangement for coplanarly positioning said one indentation opposite to said second indentation for forming a resultant template opening including the two indentations, the coupling arrangement having means located along the one edge of said first and said second planar portions for generating a repulsive force therebetween.

23. A releasable template according to claim 22, wherein said repulsive force generating means include a first and a second magnetic body respectively embedded in said first and said second planar portion, whereby the two magnetic bodies are poled to repel each other.

24. A releasable template according to claim 23, wherein the coupling arrangement further comprises:
   a pair of fastening bolt members slidably engaged with at least one of said first and said second planar portions; and
   a coupling bar transversally attached to said pair of fastening bolt members and positioned against said at least one of the planar portions when the template is in its open position.

25. A releasable template according to claim 24, further comprising actuating means attached to said coupling bar for selectively coplanarly moving the first and the second portions relative to each other thereby diminishing or enlarging the resultant template opening.

26. A releasable template according to claim 22, wherein each of said first and said second planar portions comprises a retaining lip located within its indentation for retaining an article within the resultant template opening when the template is in its closed position.

27. A releasable template according to claim 26, wherein the retaining lips are dimensioned to release the article out of the resultant template opening when the template is in its open position.

28. A releasable template comprising:
   a first planar portion having in one of its edges at least one indentation of predetermined dimensions;
   a second planar portion having in one of its edges at least a second indentation of predetermined dimensions;
   a third planar portion, coplanarly positioned between said first and said second portions, having at least third and fourth indentations formed in two substantially parallel edges thereof; and
   a coupling arrangement for coplanarly positioning said one and said second indentations respectively opposite to said third and fourth indentations thereby forming a first resultant template opening including said one and said third indentation and a second resultant template opening including said second and said fourth indentation.

* * * * *